United States Patent
Napper

(10) Patent No.: US 7,308,148 B2
(45) Date of Patent: Dec. 11, 2007

(54) METHOD OF COMPRESSING DIGITAL INK

(75) Inventor: Jonathon Leigh Napper, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 672 days.

(21) Appl. No.: 10/492,154

(22) PCT Filed: Oct. 15, 2002

(86) PCT No.: PCT/AU02/01391

§ 371 (c)(1), (2), (4) Date: Apr. 9, 2004

(87) PCT Pub. No.: WO03/044723

PCT Pub. Date: May 30, 2003

(65) Prior Publication Data

US 2004/0247191 A1 Dec. 9, 2004

(30) Foreign Application Priority Data

Nov. 16, 2001 (AU) .................... PR8902

(51) Int. Cl.
*G06T 9/20* (2006.01)
*G06T 9/00* (2006.01)
*G06T 7/00* (2006.01)
*G06K 9/36* (2006.01)
*G06K 9/00* (2006.01)

(52) U.S. Cl. .............. 382/238; 382/242; 382/244; 382/186; 382/187

(58) Field of Classification Search ........ 382/186–187, 382/229–238, 241–246, 119, 182
See application file for complete search history.

(56) References Cited

U.S. PATENT DOCUMENTS

| 4,509,150 A | 4/1985 | Davis |
| 4,542,412 A * | 9/1985 | Fuse et al. .................. 382/199 |
| 4,781,096 A | 11/1988 | Suzuki et al. |
| 5,644,652 A | 7/1997 | Bellrgarda et al. |
| 6,101,280 A | 8/2000 | Reynolds |
| 6,333,996 B1 | 12/2001 | Kato |
| 2004/0085585 A1 * | 5/2004 | Feng et al. .................. 358/2.1 |

FOREIGN PATENT DOCUMENTS

| EP | 0848350 A | 6/1998 |
| WO | WO 94/03853 A | 2/1994 |
| WO | WO 02/51056 A | 6/2002 |

OTHER PUBLICATIONS

Deering, M Ed—Cook R Association for Computing Machinery: "Geometry Compression" Computer Graphics Proceedings, Los Angeles, Aug. 6-11, 1995, Computer Graphics Proceedings (SIGGRAPH), New York, IEEE, US, Aug. 6, 1995, pp. 13-20, XP000546211 ISBN: 0-89791-701-4 *p. 15*.

* cited by examiner

*Primary Examiner*—Scott A. Rogers

(57) ABSTRACT

A method of compressing a digital ink input is disclosed. The digital ink includes a sequence of strokes, each stroke being represented as a series of digital words representing x and y co-ordinates, the compressed digital ink data including, for each stroke, at least one reference co-ordinate expressed in absolute terms, with subsequent co-ordinates being expressed in terms of an offset from a co-ordinate, estimated using linear prediction, such that a given co-ordinate may be determined on the basis of the previous m co-ordinates as formula (1); where $c_i$ are coefficients dependent on the nature of the digital ink, and $\alpha$ represents either an x or a y co-ordinate.

9 Claims, 5 Drawing Sheets

METHOD OF COMPRESSING DIGITAL INK

TECHNICAL FIELD

The present invention relates to methods of compressing digital ink and in particular, to compression methods using linear predictive encoding schemes.

BACKGROUND ART

The growth in use of portable pen-based computing devices, such as PDAs, has resulted in an increased desire to process the input 'stroke' data in time and data-storage efficient manner. Prior art techniques involve translating the input stroke data, which is input via means of a stylus tracing out a character on a suitable touchscreen, into computer-readable, or ASCII, text.

In this way, if a user enters handwritten data, it is generally stored in the form of plain ASCII text in the device's data store. Then, if the user wishes to perform a search for a word amongst that data, he must enter the handwritten word, which is again translated, using character recognition techniques, into plain ASCII text to enable the computer to locate the stored word, which is then displayed in a computer-generated typeface or font.

Increasingly, it is felt that the step of translating handwritten data entries into ASCII text is an unnecessary step. However, it is presently the most efficient way to store large amounts of data. This is because the storage of handwritten data as image files is prohibitively memory intensive. Even storing the strokes as a series of x-y co-ordinates can consume large amounts of memory.

Generally, digital ink is structured as a sequence of strokes that begin when the pen device makes contact with a drawing surface and ends when the pen device is lifted. Each stroke comprises a set of sampled coordinates that define the movement of the pen whilst the pen is in contact with the drawing surface.

As stated, the increasing use of pen computing and the emergence of paper-based interfaces to networked computing resources has highlighted the need for techniques to compress digital ink. This is illustrated in a press release by Anoto: "Anoto, Ericsson, and Time Manager Take Pen and Paper into the Digital Age with the Anoto Technology", 6 Apr., 2000. Since written ink is a more expressive and flexible format than text, it is desirable that pen-computing systems support the storage, retrieval, and reproduction of raw digital ink. However, since digital ink representations of information are often far larger than their corresponding traditional representation (e.g. the digital ink representing handwriting is far larger than the corresponding ASCII text), digital ink compression is needed to ensure efficient transmission and storage of this data type.

In the field of telephony, delta encoding is a known technique for the compression of telephone-quality speech signals. Differential Pulse Code Modulation (DPCM) exploits the fact that most of the energy in a speech signal occurs at low frequencies, and thus given a sufficiently high sample rate the difference between successive samples is generally smaller than the magnitude of the samples themselves. A more sophisticated compression scheme, Adaptive Differential Pulse Code Modulation (ADPCM) is used to compress 64 Kb/s speech signals to a number of bit rates down to 16 Kb/s. This technique, defined in ITU standard 0.726 (International Telecommunication Union (ITU), "40, 32, 24, 16 Kbit/s Adaptive Differential Pulse Code Modulation (ADPCM)", *ITU-T Recommendation G.726*) adapts the magnitude of the delta step size based on a statistical analysis of a short-term frame of the speech signal.

Similarly, linear predictive coding (LPC) has been used to compress telephone-quality speech to very low bit-rates. Generally, LPC audio compression is lossy and introduces significant distortion, an example being the LPC-10e standard that produces poor-quality, synthetic sounding compressed speech at 2.4 Kb/s. More sophisticated compression schemes based on LPC have been developed that produce much higher quality signals at correspondingly higher bit rates (e.g. the Code-Excited Linear Prediction (CELP) compression scheme described in ITU standard G.723.1 (International Telecommunication Union (ITU), "Dual Rate Speech Coder for Multimedia Telecommunication Transmitting at 5.3 and 6.3 Kbit/s", *ITU-T Recommendation G.723.1*).

U.S. Pat. No. 6,212,295 describes a procedure for the reconstruction of handwritten dynamics by "accumulating increments of values that are some function of the original data". The technique uses a non-linear function to accentuate the velocity component of the original signal for use in a handwritten signature verification system.

A number of commercial vendors have developed products that perform lossy digital ink compression. Communications Intelligence Corporation offer a product called INK-ShrINK that "stores high resolution electronic ink for far less than a compressed image". The product offers six levels of optimization that offer a trade off between size and reconstructed image quality. Another ink compression scheme based on approximation using Bezier curves is described in the JOT standard: Slate Corporation, "JOT—A Specification for an Ink Storage and Interchange Format", May 1993.

These prior art documents indicate that an efficient and straightforward compression scheme is required in order to capitalise on the potential offered by digital ink. The present invention aims to address this problem.

DISCLOSURE OF INVENTION

The invention includes techniques for the streamable, loss-less compression of digital ink. Related work in the area is presented, along with a number of algorithms for the delta encoding and linear predictive coding of digital ink. Compression results for the algorithms are given, along with a discussion on the worst-case behavior of the best performing compression scheme.

The focus of the invention is on compression of digital ink. Further, the compression techniques are designed to be streamable and utilize minimal memory and processing resources, making them suitable for low-cost embedded environments. Embodiments of the invention may allow for either loss-less or lossy compression, the distinction to be determined as an implementation feature.

According to a broad form of the present invention, there is provided a method of compressing a digital ink input including a sequence of strokes, each stroke being represented as a series of digital words representing x and y co-ordinates, the compressed digital ink data including, for each stroke, at least one reference co-ordinate expressed in absolute terms, with subsequent co-ordinates being expressed in terms of an offset from a co-ordinate, estimated using linear prediction, such that a given co-ordinate may be determined on the basis of the previous m co-ordinates as:

$$\tilde{\alpha}_n = \sum_{i=1}^{m} c_i \alpha_{n-i}$$

Where $c_i$ are coefficients selected to model characteristics of the digital ink, and $\alpha$ represents either an x or a y co-ordinate.

The x and y co-ordinates refer to a planar space in which x represents the direction of handwriting.

Preferably, m is 2, and a given co-ordinate may be defined:

$$\tilde{\alpha}_n = c_1 \alpha_{n-1} + c_2 \alpha_{n-2}$$

Preferably, $C_1 > 0$ and $C_2 < 0$. These limits are empirically found to offer acceptable performance.

Preferably, $1 \leq C_1 \leq 3$ and $-2 \leq C_2 \leq 1$. These narrower ranges offer enhanced performance over the previously declared ranges.

Preferably, $C_1 = 2$ and $C_2 = -1$. These values offer acceptable performance, and as they are integer values, are quick and simple to implement.

Alternatively, the coefficient values ($C_i$) for x co-ordinates are different to the coefficients for y co-ordinates. Different coefficients to encode for x and y co-ordinates are preferable due to the non-symmetry of most handwriting. For instance, there tends to a longer strokes in the y direction than in the x direction due to the tails on letters such as 'y', 'g', and letters such as 'k', 'l', 'b' and 'd' having relatively long vertical elements.

Preferably, for x co-ordinates: $C_1 = 1.857$, $C_2 = -0.856$, and for y co-ordinates: $C_1 = 1.912$, $C_2 = -0.913$. These values are empirically found to offer optimum performance.

Preferably, m is 3, and a given co-ordinate may be defined:

$$\tilde{\alpha}_n = c_1 \alpha_{n-1} + c_2 \alpha_{n-2} + c_3 \alpha_{n-3}$$

Using three previous co-ordinates offers enhanced prediction capabilities, and hence, improved encoding.

Preferably, $C_1 > 0$ and $C_2 < 0$ and $C_3 < 1$.

Preferably, the coefficient values ($C_i$) for x co-ordinates are different to the coefficients for y co-ordinates.

Preferably, for x co-ordinates: $C_1 = 1.799$, $C_2 = -0.722$, $C_3 = -0.078$, and for y co-ordinates: $C_1 = 2.009$, $C_2 = -1.107$, $C_3 = -0.098$.

BRIEF DESCRIPTION OF FIGURES

The present invention should become apparent from the following description, which is given by way of example only, of a preferred but non-limiting embodiment thereof, described in connection with the accompanying figures, wherein.

MODES FOR CARRYING OUT THE INVENTION

Figure 1:
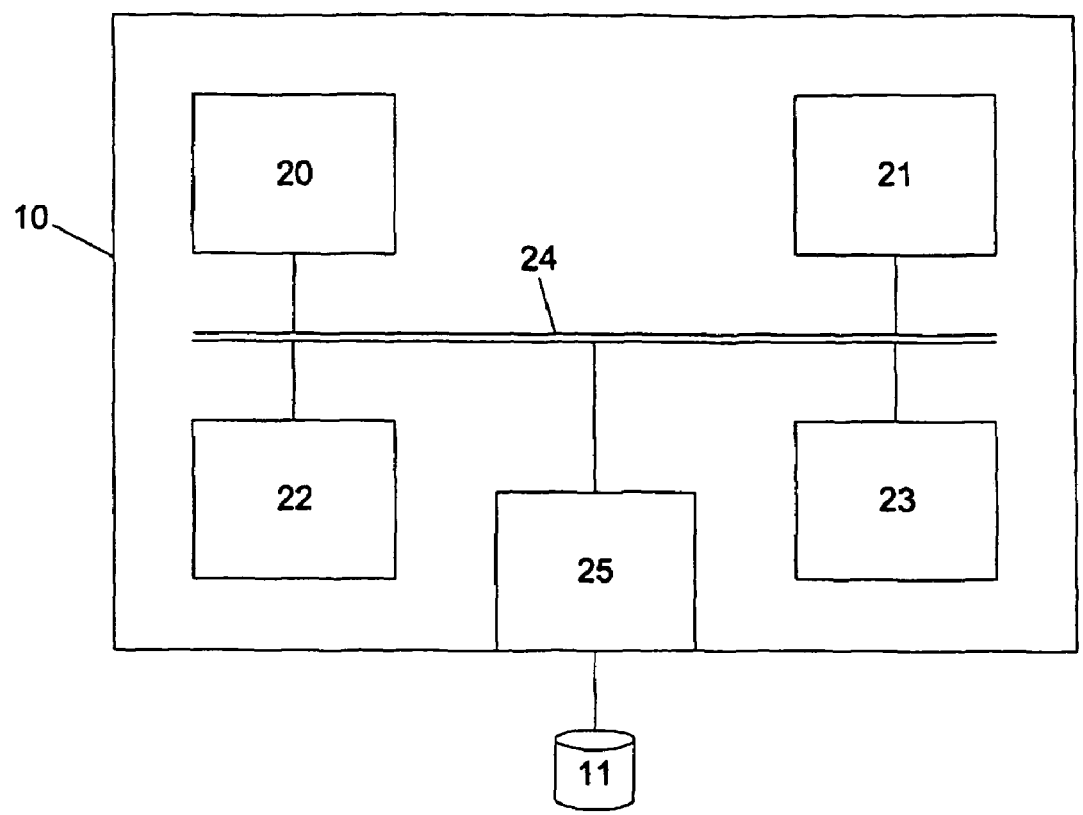
FIG. 1 illustrates a processor suitable for performing methods according to embodiments of the present invention.

The following modes are described as applied to the written description and appended claims in order to provide a more precise understanding of the subject matter of the present invention.

The present invention provides several embodiments which provide compression of digital ink. In the figures, incorporated to illustrate the features of the present invention, like reference numerals are used to identify like parts throughout the figures.

A preferred, but non-limiting, embodiment of the present invention is shown in FIG. 1.

The process can be performed using a processing system an example of which is shown in FIG. 1.

In particular, the processing system 10 generally includes at least a processor 20, a memory 21, and an input device 22, such as a graphics tablet and/or keyboard, an output device 23, such as a display, coupled together via a bus 24 as shown. An external interface is also provided as shown at 25, for coupling the processing system to a store 11, such as a database.

In use, the processing system is adapted to allow data to be stored in and/or retrieved from the database 11. This allows the processor to receive data via the input, process the data using data stored in the store. This in turn allows the processing system to produce a compressed version of the input digital ink data. From this, it will be appreciated that the processing system 10 may be any form of processing system such as a computer, a laptop, server, specialised hardware, or the like.

The following examples provide a more detailed outline of one embodiment of the present invention. These examples are intended to be merely illustrative and not limiting of the scope of the present invention.

In the description which follows, digital ink is represented as an array of strokes, each of which begins with a pen-down event and continues until the corresponding pen-up event. Points within the strokes are stored as 32-bit X and Y coordinates sampled at 100 Hz. Other resolutions and sample rates are of course possible, with these values being exemplary only. In trials, sample digital ink was collected using a Wacom digitizer, and includes a mixture of cursive handwriting, printed text, and hand-drawn images. The sample digital ink was divided into two disjoint databases, one used for training (where required), and the other used for testing.

Unless otherwise specified, X and Y coordinates are encoded using the same procedure, so equations for the encoding and decoding of Y coordinates can be derived mechanically from the equations given for the encoding and decoding of the X coordinates. Note that other ink representations include additional information about the dynamics of a stroke such as pen pressure and orientation. It is anticipated that this information can be successfully compressed using the same or similar techniques as described below.

Delta Encoding

This part details the algorithms and experimental results of digital ink compression using delta encoding, and discusses the use of entropy encoding for the compression of the delta codes.

Simple Delta Encoding

A simple digital ink compression scheme can be employed by observing that the difference between successive points in an ink stroke is generally much less than the size of the point coordinates themselves. As a result, transmitting or storing the difference between individual samples rather than the samples themselves will allow compression of the digital ink stream. To encode the data, the first point is transmitted with full precision (i.e. 32-bits), with each successive point encoded as a pair of X and Y offsets (that is, X and Y deltas) from its predecessor:

$$\Delta x_n = x_n - x_{n-1}$$

Since the sample deltas are much smaller than the samples themselves, they can be encoded using fewer bits. To decode the compressed stream:

$$x_n = x_{n-1} + \Delta x_n$$

Figure 2:
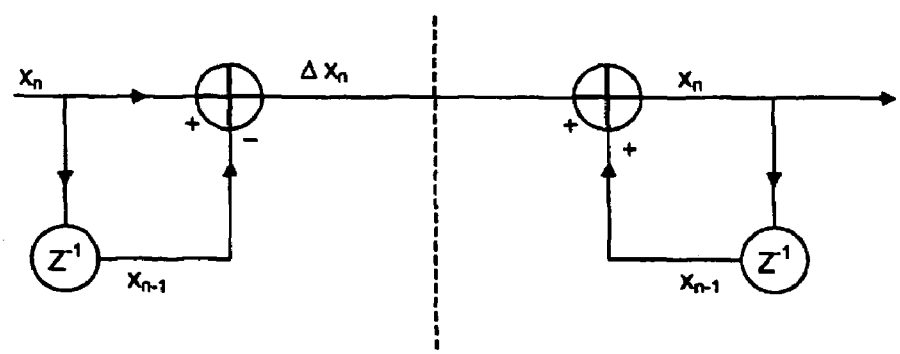
FIG. 2 shows a signal flow graph for a delta encoder according to an embodiment of the invention.

The signal flow graph for delta encoding is given in FIG. 2. Using 16-bit delta encoding, the test database was compressed by a factor of 1.97 (49.24%), which is approximately the expected value given the overhead of array sizes and initial point transmission.

Adaptive Delta Encoding

Examination of the deltas derived during compression reveals that they can usually be encoded using far fewer bits than specified above. However, strokes containing high velocity segments (i.e. large changes in position between samples and thus large deltas) will require more bits for encoding. By measuring the dynamic range of the deltas within a stroke, the optimal number of bits can be selected for delta encoding:

$$\Delta x_{bits} = \lfloor \log_2(\Delta x_{max} - \Delta x_{min}) + 1 \rfloor$$

$$\Delta x_n = x_n - x_{n-1} - \Delta x_{min}$$

where $\Delta x_{min}$ and $\Delta x_{max}$ are the minimum and maximum sample deltas in the stream and $\Delta x_{bits}$ contains the number of bits required to encode the range $\Delta x_{max}$ and $\Delta x_{min}$. To encode the signal, the first sample is transmitted using full precision, followed by $\Delta x_{bits}$ (so the decoder knows how many bits to receive for each delta) and $\Delta x_{min}$ (so the decoder can recreate the original value of $x_n$). The $\Delta x_n$ sample deltas are then encoded using $\Delta x_{bits}$ bits and transmitted.

To decode the transmission, the values for $\Delta x_{bits}$ and $\Delta x_{min}$ are read, and the strokes are reconstructed using:

$$x_n = x_{n-1} + \Delta x_n + \Delta x_{min}$$

Using this scheme the database was compressed by a factor of 7.43 (86.54%). Note that this compression scheme requires all points in a stroke to be available for the dynamic range calculation before compression can take place, and thus cannot compress a stream of points without buffering. A streamable adaptive delta-encoding scheme could be implemented using short-term statistics to estimate the optimal number of bits for the encoding of deltas.

Improved Adaptive Delta Encoding

In the compression scheme detailed above, the full-precision encoding of the initial points of each stroke and the overhead of transmitting the array sizes comprises a significant fraction of the bit stream. To reduce this overhead, the initial stroke points can be delta encoded based on their offset from the last point in the previous stroke. Since the majority of these offsets are small (since adjacent strokes tend to be spatially co-located), but large offsets must be accommodated without significant overhead, the values are encoded using a variable-sized numeric value.

To do this, n bits of the numeric value are transmitted, followed by a single bit flag indicating whether the value is complete (i.e. the value is fully defined by the n bits) or more bits are required to complete the value. If so, another n bits are transmitted, again followed by a completion flag. Using this scheme, small values are encoded with a small number of bits, but large values can be represented with reasonable efficiency. This same scheme is used to transmit the stroke array and point array sizes. All following compression schemes use these techniques for initial point and array size encoding unless otherwise indicated. Using this scheme the test database was compressed by a factor of 8.20 (87.80%).

Adaptive Huffman Delta Encoding

Figure 5:
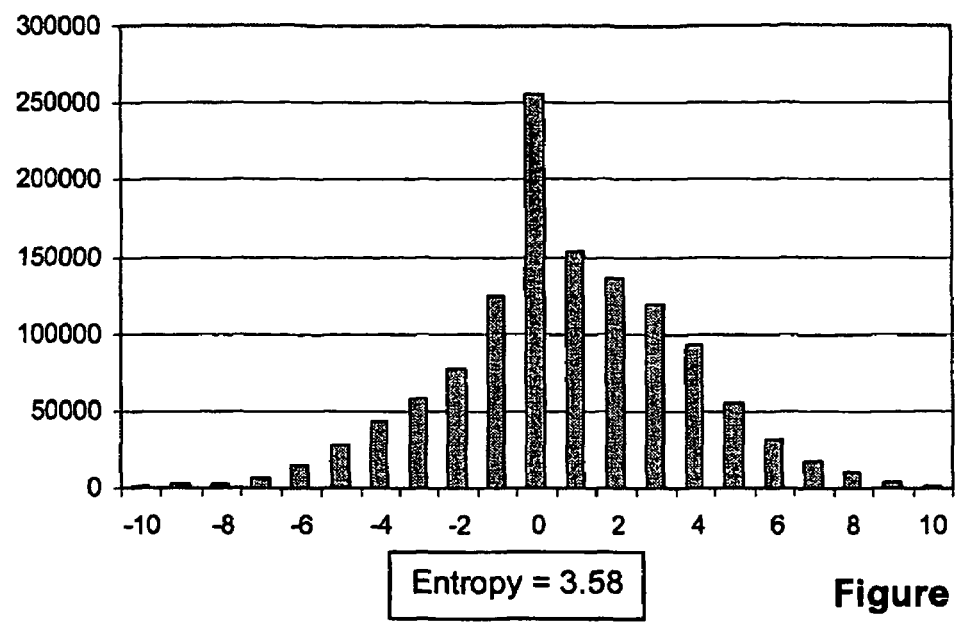
FIG. 5 shows a histogram of the deltas derived from the digital ink in the training database, together with the corresponding entropy value.

While the adaptive delta encoding significantly improved the compression by encoding the deltas using the minimum number of bits needed to encode the entire dynamic range, all deltas in a stroke are encoded using the same number of bits, regardless of their frequency in the stream. FIG. 5 shows a histogram of the deltas derived from the digital ink in the training database, together with the corresponding entropy value for the distribution calculated using:

$$entropy = -\sum_{x \in X} p(x) \log_2 p(x)$$

Clearly, further compression gains should be possible by entropy encoding the delta values, since the delta values are not randomly distributed. Using variable-length source codes such as those constructed by Huffman coding can often result in the use of fewer bits per source value than fixed-length codes such as those used above. To do this, an adaptive Huffman coding scheme (see J. Vitter—"Design and Analysis of Dynamic Huffman Codes"—*Journal of the ACM*, 34, pp. 825-845, 1987) was used to encode the point deltas. Adaptive Huffman coding determines the mapping from source message to code words based on a running estimate of the source message probabilities. The selected code words are constantly updated to remain optimal for the current probability estimates.

Figure 3:
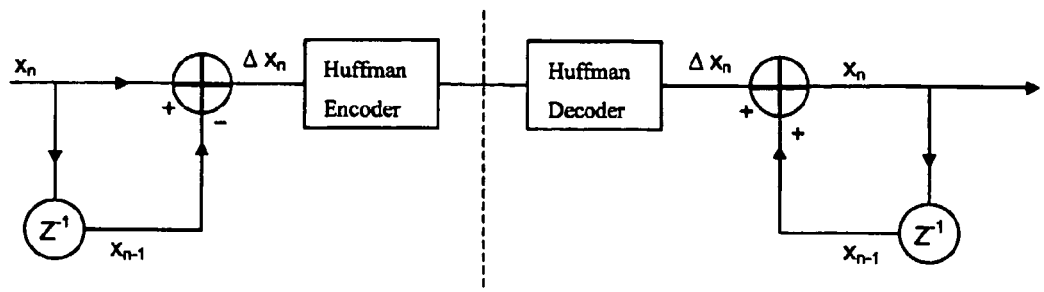
FIG. 3 shows a signal flow graph for an adaptive Huffman Delta encoder according to an embodiment of the invention.

To encode the digital ink stream, the alphabet for the Huffman coding was defined as the set of deltas in the range −16 . . . 16, an escape code to represent values outside this range, and an end code to indicate the end of a stroke. The X and Y deltas for each point are calculated, encoded using the adaptive Huffman encoder, and transmitted. If the absolute value of a delta is greater than 16, an escape code is transmitted, followed by the delta transmitted as a 16-bit value. When all points have been transmitted, the end code is sent to indicate the end of a stroke. The signal flow graph for entropy coded delta compression is given in FIG. 3. Using this scheme the database was compressed by a factor of 9.66 (89.65%).

Static Huffman Delta Encoding

The code words used by adaptive Huffman coding are generated dynamically during encoding. As a result, the bit stream must also include the uncompressed alphabet entries as they are encountered in the stream. Compressing the deltas using a predefined static Huffman table generated from a set of training data can reduce this overhead, since transmission of the table entries will not be required. However, while the generated code words will be optimal for compressing the training database as a whole, they may not be optimal for arbitrary individual strokes, resulting in possibly less than optimal compression of the deltas.

To encode the digital ink, a Huffman table of delta values was calculated using the training database, as shown in Table I below. Using this scheme, the database was compressed by a factor of 9.69 (89.68%), a very slight improvement over the adaptive Huffman encoding scheme.

TABLE 1

Huffman encoded point deltas

| | |
|---|---|
| −16 | 10110100011011011110 |
| −15 | 1011010001101100 |
| −14 | 1011010001101111 |
| −13 | 10110100011010 |
| −12 | 101101000111 |
| −11 | 1011010000 |
| −10 | 1101010000 |
| −9 | 101101001 |
| −8 | 110101001 |
| −7 | 11010101 |
| −6 | 1101011 |
| −5 | 111010 |
| −4 | 10111 |
| −3 | 11100 |
| −2 | 1010 |
| −1 | 010 |
| 0 | 00 |
| 1 | 100 |
| 2 | 011 |
| 3 | 1111 |
| 4 | 1100 |
| 5 | 11011 |
| 6 | 111011 |
| 7 | 101100 |
| 8 | 1011011 |
| 9 | 10110101 |
| 10 | 1101010001 |
| 11 | 10110100010 |
| 12 | 101101000 1100 |
| 13 | 10110100011 0110 |
| 14 | 101101000110110110 |
| 15 | 10110100011011011111 |
| 16 | 10110100011011011110 |
| escape | 10110100011011010 |
| end | 110100 |

Linear Predictive Coding

Linear prediction (described in, for instance, J. Stein, *Digital Signal Processing—A Computer Science Perspective*, John Whiley & Sons Inc., 2000) is the process of estimating the next sample of an observed signal based on the linear interpolation of past samples. Any signal that is not random is somewhat linearly predictable based on the previous m samples using:

$$\tilde{x}_n = \sum_{i=1}^{m} c_i x_{n-i}$$

The residual error is the difference between the estimated sample value and the observed sample value:

$$e_n = \tilde{x}_n - x_n = \sum_{i=1}^{m} c_i x_{n-i} - x_n$$

To use linear prediction (LP) for compression, an estimate of the next sample is found using the predictive model and the previous samples, and the residual error of the estimate is transmitted. Thus, the more accurate the estimate is, the smaller the residual error will be resulting in fewer bits required for transmission.

Simple Linear Prediction

To perform linear prediction, the set of coefficients $\{c_1, \ldots, c_m\}$ must be determined. With m=2 (i.e. the next sample is predicted based on the previous 2 samples), a simple set of coefficients can be derived by assuming the next sample will equal the previous sample $x_{n-1}$ plus the previous delta $x_{n-1} - x_{n-2}$:

$$x_n = x_{n-1} + (x_{n-1} - x_{n-2}) = 2x_{n-1} - x_{n-2}$$

Thus the coefficients $\{c_1 = 2, c_2 = -1\}$ are selected. To test and compare the predictive ability of these coefficients, the mean-squared residual error of the X and Y components for the digital ink in the training database was calculated, and is shown in Table 2 below.

Figure 6:
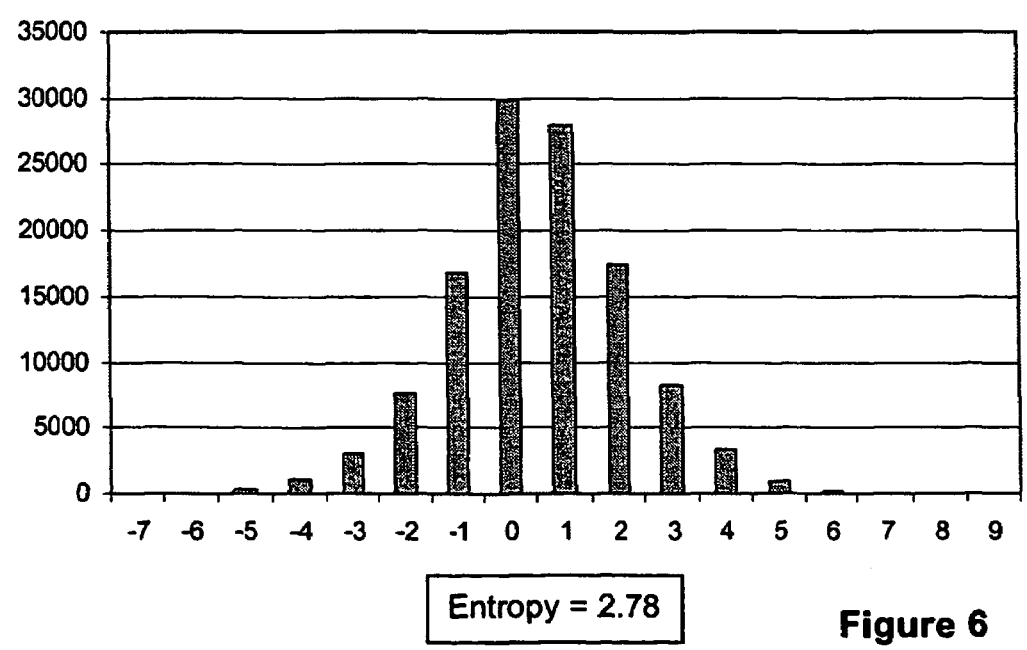
FIG. 6 shows a histogram of the x deltas derived from the digital ink in the training database, together with the corresponding entropy value.
Figure 7:
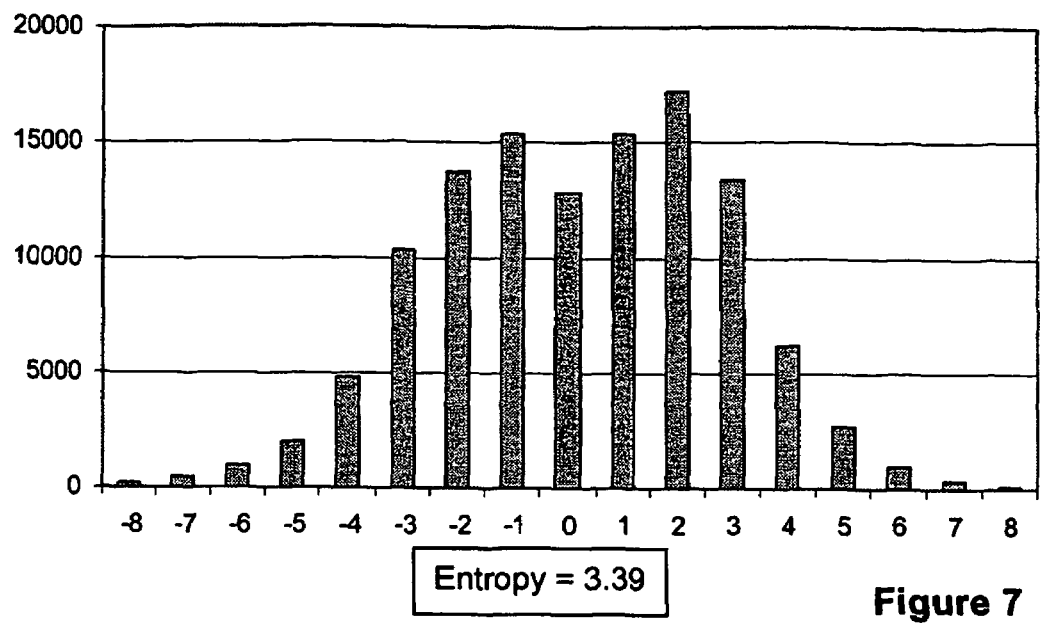
FIG. 7 shows a histogram of the y deltas derived from the digital ink in the training database, together with the corresponding entropy value.
Figure 8:
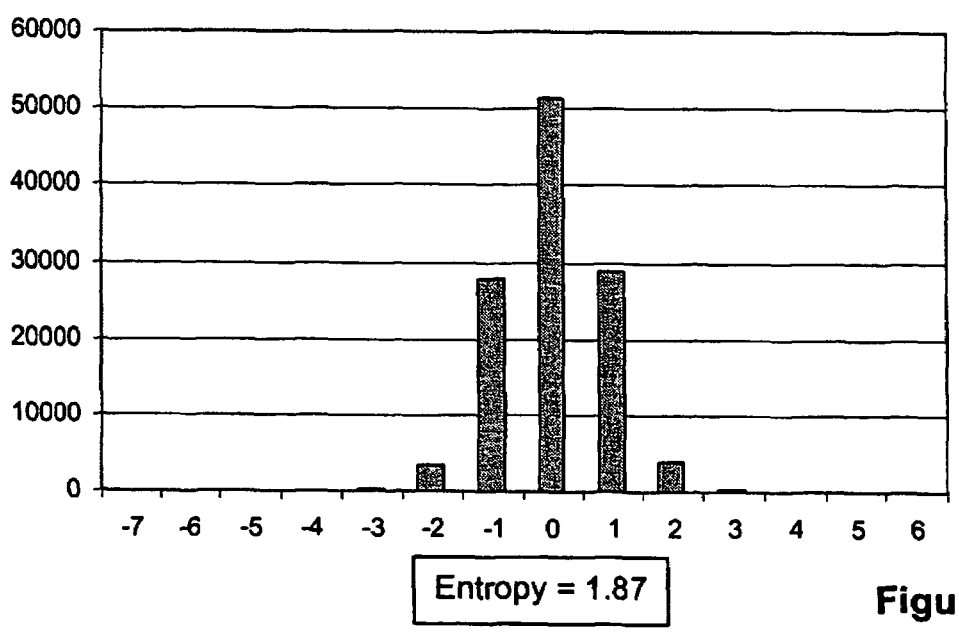
FIG. 8 shows a histogram of the x residuals using linear prediction, together with the corresponding entropy value.
Figure 9:
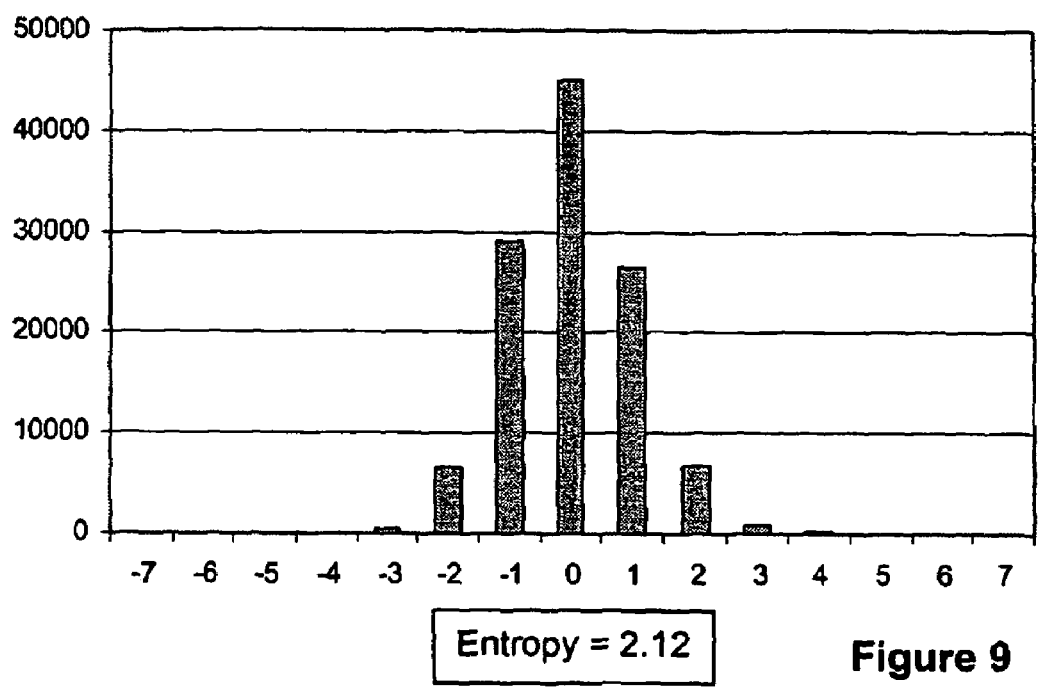
FIG. 9 shows a histogram of the y residuals using linear prediction, together with the corresponding entropy value.

Histograms of the X and Y residual components for the linear prediction are given in FIGS. 8 and 9, along with the entropy of these distributions. The reduction in entropy of these residual values is apparent when compared to the histograms of the X and Y deltas derived from the same database (see FIGS. 6 and 7), indicating that further compression should be possible by using linear prediction.

Figure 4:
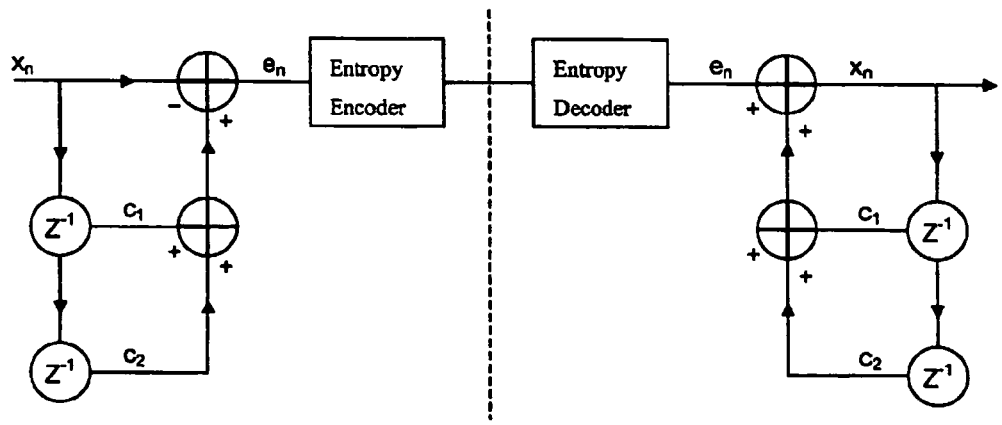
FIG. 4 shows a signal flow graph for a linear predictive encoder according to an embodiment of the invention.

A static Huffman table was generated using the residual error of the linear prediction estimates of the digital ink in the training database. To encode the digital ink, the initial point is transmitted followed by the Huffman encoded residual errors of the predicted values for subsequent points. The signal flow graph for this procedure is given in FIG. 4. Using this scheme the test database was compressed by a factor of 14.30 (93.01%), a significant improvement over the best delta-encoding scheme.

Improved Linear Prediction

The LP coefficients used above were found using the assumption that the next sample will equal the previous sample plus the previous delta. However, potentially superior coefficients can be derived from the training data that more accurately model the bias inherent in the generative process of handwriting.

Given a series of samples $\{x_1, \ldots, x_n\}$, we need to find the coefficients $c_1$ and $c_2$ that predict $x_i$ from previous data points $x_{i-2}$ and $x_{i-1}$ with the minimum error in a least squares sense. To do this we find the coefficients such that the sum-squared error S of the predicted values is minimized. An approach for this is derived from P. Devijver and J. Kittler, *Pattern Recognition—A Statistical Approach*, Prentice Hall, 1982:

$$S = \sum_{i=3}^{i=n} e_i^2$$

where the prediction error is calculated as:

$$e_i = c_1 x_{n-2} + c_2 x_{n-1} - x_n$$

Ideally, S should be zero (i.e. each point is predicted with no error). If c is the 2-dimensional vector of coefficients:

$$c = \begin{bmatrix} c_1 \\ c_2 \end{bmatrix}$$

and x is the n−2 dimensioned vector of observed signal values:

$$x = \begin{bmatrix} x_3 \\ x_4 \\ \vdots \\ x_n \end{bmatrix}$$

and A is the 2×(n−2) matrix of the samples used for prediction:

$$A = \begin{bmatrix} x_1 & x_2 \\ x_2 & x_3 \\ \vdots & \vdots \\ x_{n-2} & x_{n-1} \end{bmatrix}$$

then to solve for S=0 we solve:

$$Ac = x$$

The classical solution:

$$c = A^{-1} x$$

is clearly not valid since $A^{-1}$ does not exist for n≠4. For n>4, matrix A is over-determined as the number of equations is greater than the number of unknowns. We can find a solution using the pseudo inverse $A^t$ (as taught in R. Penrose, "A Generalized Inverse for Matrices", *Proceedings of the Cambridge Philosophical Society*, 51, pp. 406-413, 1955) of A, which will minimize the error in a least squares sense:

$$c = A^t x$$

The pseudo-inverse $A^t$ will always exist even if there is a linear dependence between the columns and rows in A or A is not square. The computation is based on singular value decomposition, and singular values less than a specific threshold δ are treated as zero:

$$\delta = n \times \text{norm}(A) \times \epsilon$$

where norm(A) is the largest singular value of A, and $\epsilon$ is a numerically small value (set to 1e−16 in the following calculations).

Using this procedure, the X coefficients $\{c_1=1.856534, c_2=-0.856130\}$ and Y coefficients $\{c_1=1.912482, c_2=-0.912907\}$ were derived. Using these coefficients, the mean-squared residual error was found to be lower than that of the original coefficients—see Table 2 below—indicating points were predicted with greater accuracy using the optimized coefficients. Using this scheme, the test database was compressed a factor of 14.35 (93.03%), a slight improvement over the original linear prediction scheme.

Linear Prediction Using Three Points

The linear prediction techniques described thus far use only the two preceding samples when calculating an estimate for the next point. However, it is possible that using more samples for the prediction of the next point will produce a more accurate estimate. To perform linear prediction based on the previous three points, the estimate for the next sample becomes:

$$\tilde{x}_n = c_1 x_{n-1} + c_2 x_{n-2} + c_3 x_{n-3}$$

Using the technique described above to calculate optimal coefficients, the X coefficients $\{c_1=1.799363, c_2=-0.721519, c_3=-0.077570\}$ and the Y coefficients $\{c_1=2.008523, c_2=-1.106576, c_3=0.097674\}$ were derived. The mean-squared residual error was found to be lower than that of the previous scheme (see Table 2), but using this scheme did not result in any improvement in the compression factor due to the quantization of the deltas.

TABLE 2

Linear prediction mean-squared residual error

| Prediction Scheme | $e_x$ | $e_y$ | $e_x + e_y$ |
|---|---|---|---|
| 3.1 Simple Linear Prediction | 0.795010 | 1.150542 | 1.945552 |
| 3.2 Improved Linear Prediction | 0.736885 | 1.094879 | 1.831764 |
| 3.3 Linear Prediction Using Three Points | 0.707117 | 1.057198 | 1.764315 |

Worst-Case Behaviour

For a linearly predictive system, the worst-case behaviour occurs when the direction of the signal changes rapidly, since the estimation procedure cannot predict the change in direction and may overshoot at the point of direction change. For digital ink, this corresponds to a rapidly drawn scribble with a high frequency of sharp direction changes (as an example, filling in a region with solid ink using a single stroke consisting of a large number of rapid ballistic up and down movements).

To test the behavior of the linear prediction compression in the worst-case scenario, a number of digital ink scribbles were created and compressed using the improved linear prediction scheme, resulting in a compression factor of 11.92 (91.61%). While this is a lower compression rate than that achieved on the more general ink samples, it still represents a reasonably high level of compression. This is largely due to the fact that the ballistic strokes generally decelerate to zero velocity before changing direction, resulting in a small prediction error at the point of direction change since the velocity (and thus the estimate of the deltas to the next sample) is low.

The invention includes a number of embodiments, and their performance has been evaluated. A summary of the results is given in Table 3 below. The best compression technique, which is based on linear predictive coding, achieves a compression factor of 14.35 (93.03%) on a large database of digital ink. The behavior of this compression scheme under pathological conditions was evaluated and found to produce acceptable results.

TABLE 3

Summary of results

| Compression Scheme | Compression Factor | % |
|---|---|---|
| 2.1 Simple Delta Encoding | 1.97 | 49.24 |
| 2.2 Adaptive Delta Encoding | 7.43 | 86.54 |

TABLE 3-continued

Summary of results

| Compression Scheme | Compression Factor | % |
|---|---|---|
| 2.3 Improved Adaptive Delta Encoding | 8.20 | 87.80 |
| 2.4 Adaptive Huffman Delta Encoding | 9.66 | 89.65 |
| 2.5 Static Huffman Delta Encoding | 9.69 | 89.68 |
| 3.1 Simple Linear Prediction | 14.30 | 93.01 |
| 3.2 Improved Linear Prediction | 14.35 | 93.03 |
| 3.3 Linear Prediction Using Three Points | 14.35 | 93.03 |
| 3.4 Worst-Case Behavior | 11.92 | 91.61 |

The invention may also be said broadly to consist in the parts, elements and features referred to or indicated in the specification of the application, individually or collectively, in any or all combinations of two or more of said parts, elements or features, and where specific integers are mentioned herein which have known equivalents in the art to which the invention relates, such known equivalents are deemed to be incorporated herein as if individually set forth.

Although the preferred embodiment has been described in detail, it should be understood that various changes, substitutions, and alterations can be made herein by one of ordinary skill in the art without departing from the scope of the present invention as hereinbefore described and as hereinafter claimed.

The invention claimed is:

1. A method of compressing a digital ink input including a sequence of strokes, each stroke being represented as a series of digital words representing x and y co-ordinates, the compressed digital ink data including, for each stroke, at least one reference co-ordinate expressed in absolute terms, with subsequent co-ordinates being expressed in terms of an offset from a co-ordinate, estimated using linear prediction, such that a given co-ordinate may be estimated on the basis of the previous 2 co-ordinates as:

$$\alpha_n = C_1 \alpha_{n-1} + C_2 \alpha_{n-2}$$

where $C_1$ and $C_2$ are coefficients selected to model characteristics of the digital ink, and $\alpha$ represents either an x or a y co-ordinate, wherein $C_1 > 0$ and $C_2 < 0$.

2. A method as claimed in claim 1 wherein:

$$1 \leq C_1 \leq 3 \text{ and}$$

$$-2 \leq C_2 \leq 1.$$

3. A method as claimed in claim 2 wherein $C_1 = 2$ and $C_2 = -1$.

4. A method as claimed in claim 1 or claim 2 wherein the coefficient values (C) for x co-ordinates are different to the coefficients for y co-ordinates.

5. A method as claimed in claim 4 wherein for x co-ordinates:

$$C_1 = 1.857$$

$$C_2 = -0.856, \text{ and}$$

for y co-ordinates:

$$C_1 = 1.912$$

$$C_2 = -0.913.$$

6. A method of compressing a digital ink input including a sequence of strokes, each stroke being represented as a series of digital words representing x and y co-ordinates, the compressed digital ink data including for each stroke, at least one reference co-ordinate expressed in absolute terms, with subsequent co-ordinates being expressed in terms of an offset from a co-ordinate, estimated using linear prediction, such that a given co-ordinate may be estimated on the basis of the previous 3 co-ordinates as:

$$\tilde{\alpha}_n = c_1 \alpha_{n-1} + c_2 \alpha_{n-2} + c_3 \alpha_{n-3}$$

where $C_1$, $C_2$ and $C_3$ are coefficients selected to model characteristics of the digital ink, and $\alpha$ represents either an x or a y co-ordinate.

7. A method as claimed in claim 6 wherein $C_1 > 0$ and $C_2 < 0$ and $C_3 < 1$.

8. A method as claimed in claim 6 or 7 wherein the coefficient values (C) for x co-ordinates are different to the coefficients for y co-ordinates.

9. A method as claimed in claim 8 wherein for x co-ordinates:

$$C_1 = 1.799$$

$$C_2 = -0.722$$

$$C_3 = -0.078, \text{ and}$$

for y co-ordinates:

$$C_1 = 2.009$$

$$C_2 = -1.107$$

$$C_3 = -0.098.$$

* * * * *